(12) United States Patent
Generazio

(10) Patent No.: US 9,279,719 B2
(45) Date of Patent: Mar. 8, 2016

(54) ELECTRIC FIELD QUANTITATIVE MEASUREMENT SYSTEM AND METHOD

(75) Inventor: Edward R. Generazio, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 394 days.

(21) Appl. No.: 13/020,025

(22) Filed: Feb. 3, 2011

(65) Prior Publication Data

US 2012/0199755 A1    Aug. 9, 2012

(51) Int. Cl.
| | |
|---|---|
| *G01R 29/12* | (2006.01) |
| *G01J 1/42* | (2006.01) |
| *G01V 3/08* | (2006.01) |
| *G01T 1/00* | (2006.01) |
| *G01R 29/00* | (2006.01) |
| *B64F 1/36* | (2006.01) |
| *G01R 29/08* | (2006.01) |
| *G01R 29/14* | (2006.01) |

(52) U.S. Cl.
CPC . *G01J 1/42* (2013.01); *B64F 1/366* (2013.01); *G01R 29/00* (2013.01); *G01R 29/0878* (2013.01); *G01T 1/00* (2013.01); *G01V 3/083* (2013.01); *G01V 3/088* (2013.01); *G01R 29/12* (2013.01); *G01R 29/14* (2013.01)

(58) Field of Classification Search
CPC ....... G01V 3/083; G01V 3/088; G01R 29/12; G01R 29/14
USPC ............. 324/452, 457, 632, 637; 342/22, 179
See application file for complete search history.

(56) References Cited

U.S. PATENT DOCUMENTS

| | | | | |
|---|---|---|---|---|
| 4,931,740 A | * | 6/1990 | Hassanzadeh et al. | 324/457 |
| 5,019,804 A | * | 5/1991 | Fraden | 340/562 |
| 5,164,673 A | * | 11/1992 | Rosener | 324/457 |
| 5,430,381 A | * | 7/1995 | Dower | 324/452 |
| 5,986,456 A | * | 11/1999 | Yamashita | 324/457 |
| 6,025,726 A | * | 2/2000 | Gershenfeld et al. | 324/671 |
| 6,031,378 A | * | 2/2000 | Rosin | 324/452 |

(Continued)

FOREIGN PATENT DOCUMENTS

| | | | | |
|---|---|---|---|---|
| GB | 2132357 A | * | 7/1984 | G01V 3/06 |
| WO | WO 02067015 A1 | * | 8/2002 | |
| WO | WO 2008152588 A2 | * | 12/2008 | A61B 5/0428 |

OTHER PUBLICATIONS

John David Jackson, "Classical Electrodynamics", John Wiley & Sons, Inc., 1962, p. 25.

(Continued)

*Primary Examiner* — Huy Q Phan
*Assistant Examiner* — Raul Rios Russo
(74) *Attorney, Agent, or Firm* — Thomas K. McBride, Jr.; Jennifer L. Riley

(57) ABSTRACT

A method and system are provided for making a quantitative measurement of an electric field. A plurality of antennas separated from one another by known distances are arrayed in a region that extends in at least one dimension. A voltage difference between at least one selected pair of antennas is measured. Each voltage difference is divided by the known distance associated with the selected pair of antennas corresponding thereto to generate a resulting quantity. The plurality of resulting quantities defined over the region quantitatively describe an electric field therein.

28 Claims, 3 Drawing Sheets

(56) References Cited

U.S. PATENT DOCUMENTS

| | | | | |
|---|---|---|---|---|
| 6,661,115 | B2* | 12/2003 | Lester | 307/10.1 |
| 6,762,726 | B2* | 7/2004 | Alden | G01R 29/0878 343/703 |
| 7,119,553 | B2* | 10/2006 | Yang et al. | 324/663 |
| 7,154,275 | B2* | 12/2006 | Zank et al. | 324/457 |
| 7,242,298 | B2* | 7/2007 | Cehelnik | 340/566 |
| 7,295,019 | B2* | 11/2007 | Yang et al. | 324/663 |
| 7,330,032 | B2* | 2/2008 | Donnangelo | 324/452 |
| 7,471,089 | B2* | 12/2008 | Zerilli et al. | 324/365 |
| 2006/0071669 | A1* | 4/2006 | Funato et al. | 324/632 |
| 2006/0164094 | A1* | 7/2006 | Golder et al. | 324/452 |
| 2007/0040545 | A1* | 2/2007 | Takiguchi | G01S 11/06 324/76.11 |
| 2008/0246485 | A1* | 10/2008 | Hibbs et al. | 324/332 |
| 2008/0303530 | A1* | 12/2008 | Coutsomitros et al. | 324/457 |
| 2009/0284405 | A1* | 11/2009 | Salmon et al. | 342/22 |
| 2009/0295366 | A1* | 12/2009 | Cehelnik | 324/76.11 |
| 2009/0295644 | A1* | 12/2009 | Curran et al. | 343/700 MS |
| 2009/0309604 | A1* | 12/2009 | Zhang | 324/457 |
| 2010/0250140 | A1* | 9/2010 | Constable et al. | 702/7 |
| 2010/0259272 | A1* | 10/2010 | Care | 324/457 |
| 2010/0271291 | A1* | 10/2010 | Care | 345/58 |
| 2012/0013354 | A1* | 1/2012 | Bowler | G01N 27/226 324/664 |
| 2012/0092019 | A1* | 4/2012 | Blum | 324/457 |

OTHER PUBLICATIONS

David Halliday et al., "Fundamentals of Physics", John Wiley & Sons, Inc., 2011, extended 9th edition, p. 468.
Paul Horowitz and Winfield Hill, "The Art of Electronics", Cambridge University Press, 1989, 2nd Edition, pp. 113 and 173.
Fairchild Semiconductor Corporation, Junction Field Effect Transistor (JFET), http://www.fairchildsemi.com/ds/mp/mpf102.pdf, 2004.

\* cited by examiner

ELECTRIC FIELD QUANTITATIVE MEASUREMENT SYSTEM AND METHOD

ORIGIN OF THE INVENTION

The invention was made by an employee of the United States Government and may be manufactured and used by or for the Government of the United States of America for governmental purposes without the payment of any royalties thereon or therefor.

BACKGROUND OF THE INVENTION

1. Field of the Invention

This invention relates to electric field measurement. More specifically, the invention is a method and system for making quantitative measurements of electric fields to include magnitude and direction thereof.

2. Description of the Related Art

Article and personnel inspection systems and methods range from labor-intensive and intrusive manual searches to mechanized systems that use non-intrusive x-ray or electromagnetic wave imaging to expose concealed articles, damage, etc. For example, most weapons detections systems rely on the concealed weapons having x-ray absorption greater than the concealing articles or the concealed weapon and having electrical conductivity large enough to be detectable by radiated electromagnetic waves. Articles that are outside the inspection capability of current inspection systems are net identified. Weapons such as ceramic knifes or plastic guns (with little or no metal content) or disassembled distributed weapons are undetectable by current day non-intrusive inspection devices. These are low density system or systems that have been made from low density materials or made low density by distributing components through a larger volume.

In another example, the degraded electrical properties of insulation surrounding conduction wires is known to have caused fatal aircraft crashes. To date, there are no inspection systems capable of non-intrusive quantitative detection and characterization of insulation degradation. Current insulation integrity systems do not measure the dielectric properties of the insulation which must be known to determine the breakdown limits of the wire-insulator system.

SUMMARY OF THE INVENTION

Accordingly, it is an object of the present invention to provide a non-intrusive article and personnel inspection system.

Another object of the present invention is to provide a method and system that is readily adapted for use in a variety of applications to include security, surveillance, and inspection systems.

Other objects and advantages of the present invention will become more obvious hereinafter in the specification and drawings.

In accordance with the present invention, a method and system are provided for making a quantitative measurement of an electric field. A plurality of antennas separated from one another by known distances are arrayed in a region that extends in at least one dimension. A voltage difference between at least one selected pair of antennas is measured. A processor divides each voltage difference by the known distance associated with the selected pair of antennas corresponding thereto to thereby generate a resulting quantity. A plurality of resulting quantities are thereby defined over the region to quantitatively describe an electric field therein.

DETAILED DESCRIPTION OF THE INVENTION

Figure 1:
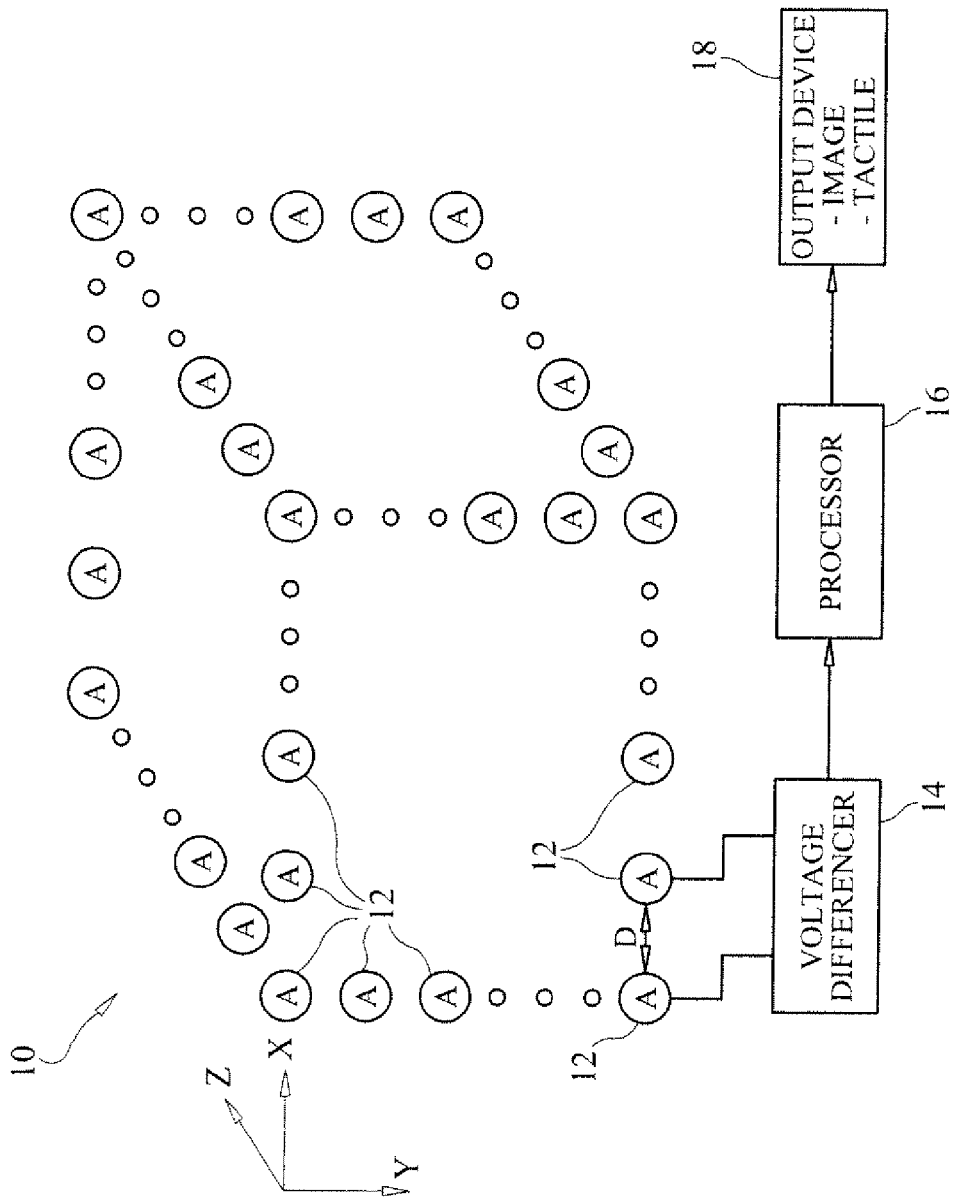
FIG. 1 is a schematic view of a system for making quantitative measurements of an electric field in accordance with an embodiment of the present invention.

Referring now to the drawings and more particularly to FIG. 1, a system for making quantitative measurements of an electric field is shown and is referenced generally by numeral 10. As will be explained further below, the quantitative measurements produced by system 10 provide information about both the magnitude and direction of the electric field at a variety of locations therein. System 10 can be configured for large scale or small scale applications to include security applications (e.g., personnel inspection at airports), surveillance applications (e.g., geographic area drive or fly over's), and inspections (e.g., package and/or luggage inspections, wire condition inspections, etc.).

System 10 includes an array of antennas 12 where the array can be comprised of individual physical antennas positioned at each of a plurality of known locations and distances from one another. Array 10 could also be realized in a virtual sense by moving a single antenna to each of the known array locations. However, movement of a single antenna 12 could generate a disturbance in an electric field that is to be measured. Accordingly, such disturbance would need to be accounted for when performing measurement calculations in accordance with the present invention. For sake of simplicity, the remainder of the description will assume that array 10 is formed using a plurality of physical antennas 12 maintained in a known spaced-apart relationship.

In the present invention, array 10 can occupy a three-dimensional space (e.g., in an x, y, z coordinate frame) as illustrated. However, the present invention is not so limited as array 10 could also exist in just two dimensions (e.g., the x-y plane), or even just a single dimension or row of antennas 12 (e.g., a row along the x coordinate). The amount of information about an electric field that is required for a particular application will typically dictate the number of dimensions defined by array 10.

Each of antennas 12 serves as an electric field sensor for its location in array 10. In accordance with the present invention, the voltage difference between one or more selected pairs of antennas 12 is measured or otherwise determined. For simplicity of illustration, a single pair of antennas 12 is coupled to a voltage differencer 14. However, it is to be understood that this capability is typically provided for multiple pairs of antennas 12 in array 10. For example, each selected pair of antennas could encompass two adjacent antennas.

Voltage differencer 14 is any device, circuit, etc., that can collect voltages sensed by a selected pair of antennas 12 and then form a difference (i.e., a voltage difference) between the voltages so-collected. Each such collected voltage difference is provided to a processor 16.

Processor 16 is any processing device, circuit, etc., that processes each voltage difference by dividing it by the distance D between the antennas of the pair. The resulting quantity is a "voltage per distance" quantity for the particular antenna pair. Since the locations of antennas 12 are known, the "voltage per distance" between the two known locations is a vector quantity. This process is repeated for each selected pair of antennas 12 in array 10. The resulting set of "voltage per distance" quantities over the known antenna array locations describes the electric field in the region occupied by array 10. Depending on the application, this information can be further processed by processor 16, or could be provided to some type of output device 18 for data "presentation" to a user. For example, output device 18 could be capable of producing a viewable image of the electric field data. In other applications, output device 18 could be capable of producing a tactile output felt by a user so that changes in an electric field would be readily recognized and located. Output device 18 could also provide other and/or multiple types of outputs without departing from the scope of the present invention.

Figure 2:
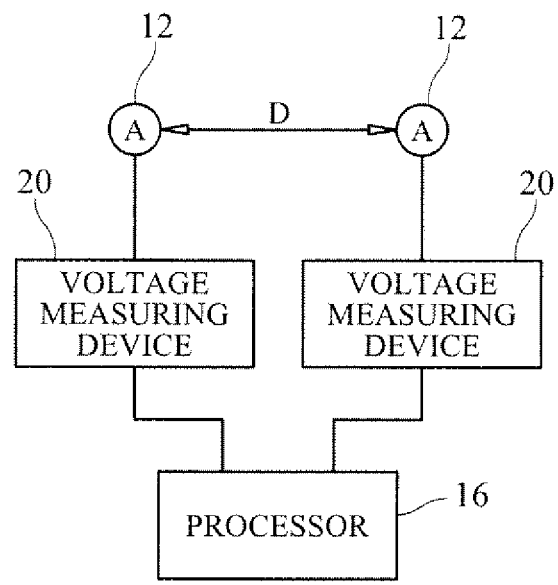
FIG. 2 is a schematic view of a selected antenna pair with each antenna having a dedicated voltage measurement device coupled thereto in accordance with an embodiment of the present invention.

The above-described functions of voltage differencer 14 can be realized in a variety of ways that do not depart from the scope of the present invention. For example, as illustrated in FIG. 2, each antenna 12 could have a dedicated voltage measuring device 20 coupled thereto. The voltages measured by two of devices 20 associated with a selected pair of antennas 12 could be provided directly to processor 16 on dedicated lines that can also indicate telemetry frequencies if devices 20 and processor 16 were configured for wireless data transmission/reception.

Figure 3:
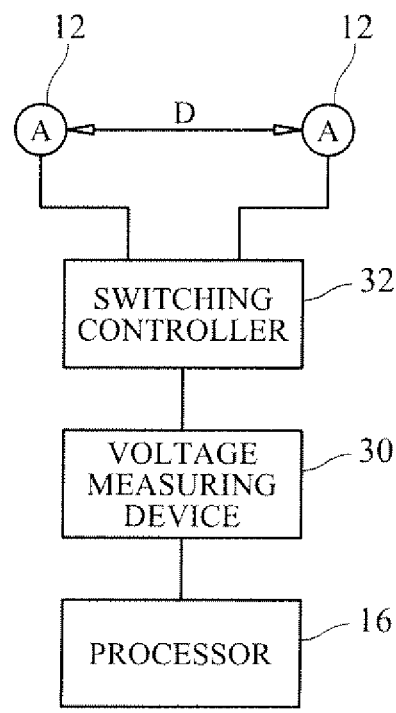
FIG. 3 is a schematic view of a selected antenna pair and a single voltage measurement device that is coupled to one antenna at a time as controlled by a switching controller in accordance with another embodiment of the present invention.

In the embodiment shown in FIG. 3, a single voltage measuring device 30 and switching controller 32 are used to collect voltages from all selected pairs of antennas 12 in array 10. As would be understood in the art, switching controller 32 couples a selected pair of antennas 12 to device 30 for a voltage difference measurement, uncouples device 30 therefrom, an then couples another selected pair of antennas 12 to device 30. This process is typically repeated in some sequential pattern to collect the voltage differences for the entire array of antennas.

Figure 4:
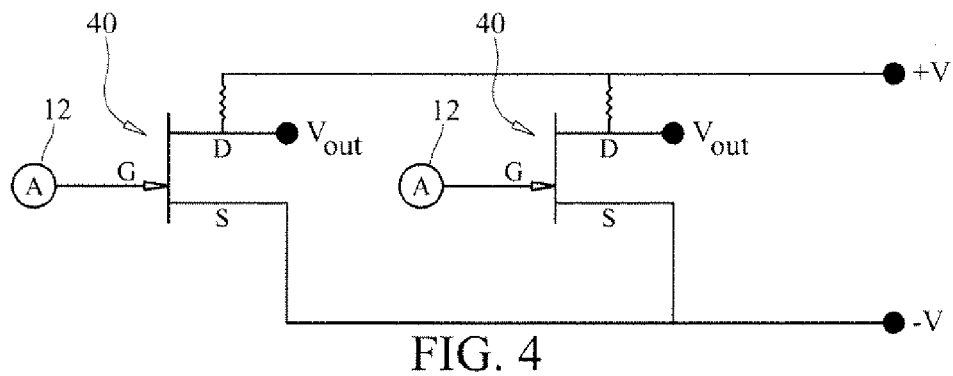
FIG. 4 is a schematic view of a Junction Field Effect Transistor (JFET) coupled to each antenna of a selected antenna pair for the purpose of measuring voltage in accordance with an embodiment of the present invention.

As mentioned above, the present invention can be realized on a variety of size scales. The antennas can range from complex aircraft-mounted antennas to simple wires or even carbon nanotubes. Likewise, the voltage measurement and/or differencing devices can range from complex systems to simple circuits. By way of example, a simple small-scale arrangement of antennas and dedicated voltage measuring devices is illustrated in FIG. 4. For simplicity of illustration, only a pair of antennas and their associated voltage measuring devices are shown. However, it is to be understood that this basic structure can be repeated to form a one, two, or three-dimensional antenna array. Each antenna 12 is coupled to a gate "G" of a Junction Field Effect Transistor (JFET) 40. For a small scale arrangement using JFET 40, antenna 12 would typically be a simple wire or line of carbon nanotubes. Coupled across the source "S" and drain "D" of each JFET 40 is a voltage supply. The voltage sensed by each antenna 12 is tapped at the drain D by each of JFET 40 as indicated by $V_{out}$. Note that other high impedance transistors, operational amplifiers, quantum dot network components, etc., could also be used in place of JFETs 40 without departing from the scope of the present invention.

The present invention can be used in a variety of ways depending on application requirements. In the case of object sensing/detection when the object produces an electric field, has electric potential, or is capable of disturbing an environmentally-existing electric field (e.g., Earth's electric field), the antenna array of the present invention is positioned or passed by a region/person/package to be examined. In other applications, an object to be tested/inspected could be placed within the antenna array of the present invention. For example, wire insulation integrity could be inspected by passing a wire (or wire bundle, harness, etc.) through the antenna array or passing the antenna array over or around a wire. Damaged insulation is detected as a redirected electric field (i.e., bending of electric field lines), non-uniform or perturbed electric field resulting in local variations in the electric field strength, and/or an increase or decrease in electric field strength including polarity reversal. One or more variations in the electric field can occur depending on the origin of the damage. For example, wire insulation that is uniformly age might only exhibit a uniform but increased electric field strength, while new impacted or worn insulation might show redirected and perturbed electric field lines as well as increased electric field strength.

Figure 5:
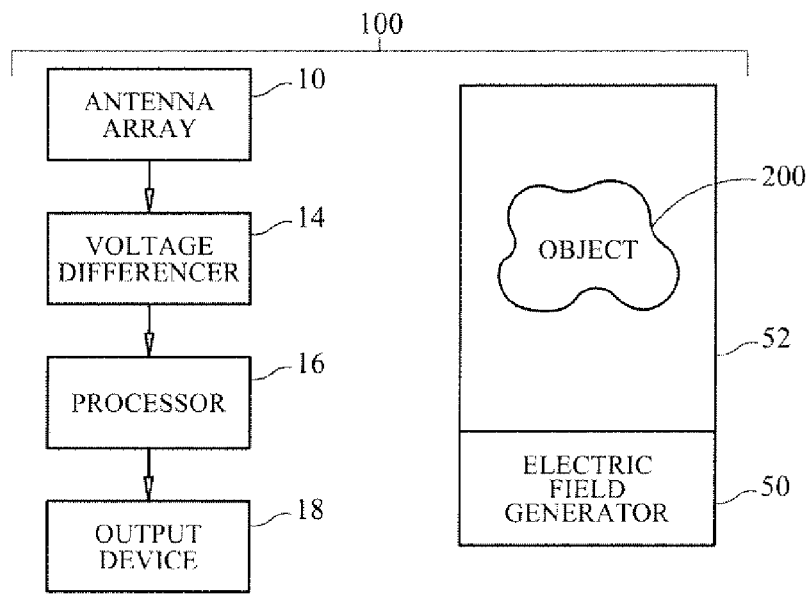
FIG. 5 is a schematic view of a system for making quantitative measurements of an extrinsically-generated electric field that has been interrupted by an object in accordance with another embodiment of the present invention.

Some applications may produce better results if an electric field of known quantity is introduced in a test region such that the presence of an object of interest appearing in the test region disturbs the generated electric field. Accordingly, FIG. 5 illustrates another system 100 for making quantitative electric field measurements that includes the elements described above and further includes an electric field generator 50 for producing a known or controllable electric field in some region 52 in which an object 200 may be present. Electric field generator 50 could be controlled by processor 16 (or a separate processor/controller). In an airport security scenario, region 52 could be a fixed housing/scanner through which personnel must pass. Region 52 could also be locally created in the case of a hand-held system 100. Region 52 could also be a fixed portal or platform with one or more of array 10, differencer 14, processor 16, and output device 18 being portable. Object 200 is representative of anything that could disturb the known/created electric field in region 52. That is, object 200 can be made of electrically-conductive and non-conductive materials. Referring again to an airport security scenario, a person without any objects of interest would disturb the electric field in region 52 in some pre-determined known fashion. However, if a person were carrying some additional object, the electric field would be disturbed in a way that was outside established norms thereby providing security personnel with an indication that further scrutiny is required.

Figure 6:
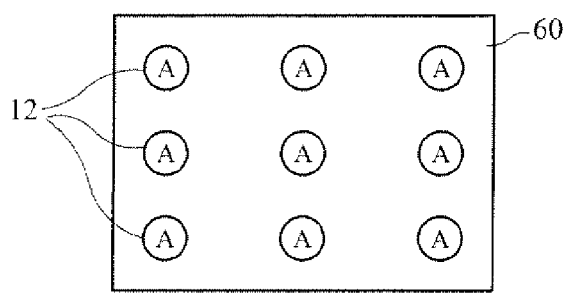
FIG. 6 illustrates a two-dimensional array supported by a triboelectrically neutral structure in accordance with another embodiment of the present invention.

The antennas used in the present invention will typically be supported in a fixed or re-configurable array by a support device/system. For example, FIG. 6 illustrates a two-dimensional array of antennas 12 mounted on a support structure 60 made from triboelectrically neutral or other suitable material so that static or image charges cannot build up or occur thereon and cause a disturbance in the electric field being measured. Support structure 60 can be rigid and fixed, rigid but reconfigurable, or flexible and reconfigurable (e.g., a garment worn by an inspector) without departing from the scope of the present invention. Antennas 12 could be mounted on or encased within support structure 60. Support structure 60 and/or antennas 12 could also be reconfigurable based upon feedback control. That is, the electric field being "observed" by antennas 12 could be used as a feedback control parameter to reconfigure or reposition structure 60 and/or antennas 12.

The advantages of the present invention are numerous. Electric fields are quantitatively measured/determined in a non-intrusive fashion. The basic concepts presented herein are applicable to a wide variety of security, surveillance and inspection applications. The invention can be scaled in size to meet the needs of various installation scenarios. Since even non-electrically conductive objects can cause a detectable disturbance in an electric field, the present invention provides the basis for a new form of object detection and localization.

Although the invention has been described relative to a specific embodiment thereof, there are numerous variations and modifications that will be readily apparent to those skilled in the art in light of the above teachings. For example, a filter(s) could be coupled between an antenna and its voltage measuring device in order to filter out unwanted background or environmental noise. It is therefore to be understood that, within the scope of the appended claims, the invention may be practiced other than as specifically described.

What is claimed as new and desired to be secured by Letters Patent of the United States is:

1. A system for making a quantitative measurement of an original true, non-distorted electric field, including static and quasi-static electric fields, independent of the time of measurement, the system comprising:
   an object;
   a plurality of antennas separated from one another by known distances, said plurality of antennas arrayed in a region that extends in at least one dimension;
   means coupled to said plurality of antennas for measuring a voltage difference between at least one selected pair of antennas from said plurality of antennas; and
   a processor coupled to said means for measuring, said processor dividing each said voltage difference by one of said known distances associated with said selected pair of antennas corresponding thereto to thereby generate a resulting quantity with a plurality of resulting quantities being thereby defined over said region to quantitatively describe an electric, electrostatic, quasi-electrostatic field therein,
   wherein said system quantitatively describes said electric field when said object is electrically conductive, and said system quantitatively describes said electric, electrostatic, and quasi-electrostatic field when said object is electrically non-conductive, and wherein the system makes a quantitative measurement of an original true, non-distorted electric field, including static an quasi-static electric fields independent of the time of measurement.

2. A system as in claim 1, wherein said means for measuring comprises a dedicated voltage measurement device coupled to each of said plurality of antennas.

3. A system as in claim 1, wherein said means for measuring comprises:
   a common voltage measurement device; and
   a controller for successively coupling and uncoupling each said selected pair of antennas to said common voltage measurement device in a sequenced and patterned fashion.

4. A system as in claim 1, further comprising an electric field generator for generating a reference electric field in proximity to said plurality of antennas.

5. A system as in claim 1, wherein said means for measuring comprises:
   a Junction Field Effect Transistor (JFET) coupled to each of said plurality of antennas, each said JFET having a gate, a source and a drain with said gate only coupled to a corresponding one of said plurality of antennas; and
   a voltage supply providing a voltage across said source and said drain of each said JFET.

6. A system as in claim 1, wherein each of said plurality of antennas comprises a plurality of carbon nanotubes.

7. A system as in claim 1, further comprising an imaging device coupled to said processor for producing an image of said electric field using said plurality of resulting quantities.

8. A system as in claim 1, further comprising a tactile feedback system coupled to said processor for producing a tactile output using said plurality of resulting quantities.

9. A system as in claim 1, further comprising a triboelectrically neutral material supporting said plurality of antennas.

10. A system as in claim 9, wherein said triboelectrically neutral material is flexible.

11. A system for making a quantitative measurement of an original true, non-distorted electric field, including static and quasi-static electric fields, independent of the time measurement, the system comprising:
    an array of antennas;
    a plurality of Junction Field Effect Transistors (JFET), a respective JFET connected to a respective antenna in said array, each said JFET having a gate directly coupled only to said respective antenna, each said JFET further having a source and a drain associated therewith;
    a voltage supply coupled across said source and said drain of each said JFET;
    means coupled to said antennas for measuring a voltage difference between selected pairs of said antennas; and
    a processor coupled to said means for measuring, said processor dividing each said voltage difference by a distance between one of said selected pairs of said antennas associated therewith to thereby generate a resulting quantity with a plurality of resulting quantities being thereby defined over said array to quantitatively describe an electric, electrostatic, and quasi-static electrostatic field encompassing said array, wherein the system makes a quantitative measurement of an original, true, non-distorted electric field, including static and quasi-static electric fields, independent of the time measurement.

12. A system as in claim 11, wherein said means for measuring comprises a dedicated voltage measurement device coupled to each of said antennas.

13. A system as in claim 11, wherein said means for measuring comprises: a common voltage measurement device; and
    a controller for successively coupling and uncoupling each of said selected pairs of antennas to said common voltage measurement device in a sequenced and patterned fashion.

14. A system as in claim 11, further comprising an electric field generator for generating a reference electric field in proximity to said array.

15. A system as in claim 11, wherein each of said antennas comprises a plurality of carbon nanotubes.

16. A system as in claim 11, further comprising an imaging device coupled to said processor for producing an image said electric field using said plurality of resulting quantities.

17. A system as in claim 11, further comprising a tactile feedback system coupled to said processor for producing a tactile output using said plurality of resulting quantities.

18. A system as in claim 11, further comprising a triboelectrically neutral material supporting said array of antennas.

19. A system as in claim 18, wherein said triboelectrically neutral material is flexible.

20. A method of making a quantitative measurement of an original true, non-distorted, electric field including static and quasi-static electric field, independent of the time of measurement, comprising the steps of:
providing an object;
using at least one antenna to sense voltage differences between known locations in a region that extends in at least one dimension; and
dividing each of said voltage differences by a distance between two of said known locations associated therewith to thereby generate a resulting quantity With a plurality of resulting quantities being thereby defined over said region to quantitatively describe an electric, electrostatic, and quasi-electrostatic field therein, wherein said electric, electrostatic and quasi-electrostatic field is quantitatively described when said object is electrically conductive, and said electric, electrostatic and quasi-electrostatic field is quantitatively described when said object is electrically non-conductive, wherein the system makes a quantitative measurement of an original, non-distorted electric field, including static and quasi-static electric fields, independent of the time measurement.

21. A method according to claim 20, wherein said step of using includes the step of moving a single antenna to each of said known locations.

22. A method according to claim 20, wherein said step of using includes the step of positioning a plurality of antennas in a spaced apart fashion in said region.

23. A method according to claim 20, further comprising the step of generating a reference electric field in proximity to said at least one antenna.

24. A method according to claim 20, further comprising the step of producing an image of said electric field using said plurality of resulting quantities.

25. A method according to claim 20, further comprising the step of producing a tactile output using said plurality of resulting quantities.

26. A method according to claim 20, further comprising the step of supporting each said antenna with a triboelectrically neutral material.

27. A method according to claim 26, wherein said step of supporting includes the step of encasing each said antenna with a triboelectrically neutral material.

28. A system as in claim 11, further including an object, and said system quantitatively describes said electric field when said object is electrically conductive, and said system quantitatively describes said electric field when said object is electrically non-conductive.

* * * * *